(12) United States Patent
Shih

(10) Patent No.: US 7,964,801 B2
(45) Date of Patent: Jun. 21, 2011

(54) CIRCUIT BOARD STRUCTURE AND FABRICATION METHOD THEREOF

(75) Inventor: Chao-Wen Shih, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 559 days.

(21) Appl. No.: 12/055,546

(22) Filed: Mar. 26, 2008

(65) Prior Publication Data

US 2008/0174009 A1    Jul. 24, 2008

(51) Int. Cl.
*H05K 1/02* (2006.01)

(52) U.S. Cl. ........ 174/259; 174/255; 174/256; 428/209; 29/829; 29/831

(58) Field of Classification Search .................. 428/209; 174/250–259; 29/829, 831
See application file for complete search history.

(56) References Cited

U.S. PATENT DOCUMENTS

| | | | |
|---|---|---|---|
| 4,893,404 A * | 1/1990 | Shirahata et al. | 29/852 |
| 4,991,060 A * | 2/1991 | Kawakami et al. | 361/778 |
| 5,078,831 A * | 1/1992 | Miyazaki et al. | 216/20 |
| 6,080,668 A * | 6/2000 | Lauffer et al. | 438/666 |

\* cited by examiner

*Primary Examiner* — Cathy Lam
(74) *Attorney, Agent, or Firm* — Pearne & Gordon LLP

(57) ABSTRACT

A circuit board structure and fabrication method thereof are disclosed, including: a circuit board with a circuit layer thereon; a reactant formed on the surface of the circuit layer, wherein the reactant is an organic metallic polymer having a polymer end and a metal ion end; and a dielectric layer formed above the reactant and the circuit board, thus forming a metallic bond between the metal ion end of the reactant and the circuit layer and forming a chemical bond between the polymer end of the reactant and the dielectric layer. Owing to enhanced bonding between the dielectric layer and the circuit board, electrical performance of the circuit board structure is improved, and the demand for fine circuits is met.

12 Claims, 3 Drawing Sheets

CIRCUIT BOARD STRUCTURE AND FABRICATION METHOD THEREOF

BACKGROUND OF THE INVENTION

1. Field of the Invention

The present invention relates generally to circuit board structures and fabrication methods thereof, and more particularly, to a circuit board structure and fabrication method thereof capable of improving the bonding between the dielectric layer and the circuit layer of the circuit board structure.

2. Description of Related Art

High-density multi-layer circuit boards with fine circuit have become a main trend of future development, wherein the quality of circuit layers of the circuit boards for signal transmission is an important factor in electrical performance of the circuit boards.

With the line-to-space ratio (L/S) decreasing, circuit boards nowadays are subject to a slight change of shape or dimensions as far as electrical quality is concerned, especially when circuit boards operate at a high-frequency state.

In addition, in a conventional circuit build-up process, the surface of a dielectric layer is roughened before a circuit layer is formed so as to increase the bonding force between the dielectric layer and the circuit layer. However, the roughening process is difficult to control. If the surface of the dielectric layer is not efficiently roughened, the circuit layer can easily detach from the dielectric layer. As for circuit boards having fine circuit, the roughening process becomes much more difficult as an efficient bonding area between the fine circuit and the dielectric layer is reduced. On the other hand, the surface of the circuit layer can be roughened by etching in the conventional fabrication process so as to improve the bonding between the circuit layer and the dielectric layer, thereby preventing delamination of the dielectric layer from the circuit board. As shown in FIGS. 1A to 1C, a circuit board 11 is provided, which has a circuit layer 12 formed on at least one surface thereof. The circuit layer 12 has a plurality of electrically connecting pads 121, as shown in FIG. 1A. Then, the surface of the circuit layer 12 is roughened by chemical etching so as to form a roughened surface 12a on the circuit layer 12, as shown in FIG. 1B. Thereafter, a dielectric layer 13 or a solder mask layer is formed on surfaces of the circuit board 11 and the circuit layer 12, as shown in FIG. 1C. The bonding force between the circuit layer 12 and the dielectric layer 13 (or the solder mask layer) is strengthened through the roughened surface 12a of the circuit layer 12, thus preventing the detachment of the uncovered dielectric layer 13 or solder mask layer from the circuit layer 12.

However, it is difficult to achieve a uniformly etched surface, and any slight change of shape or dimensions of the circuit layer can affect the electrical quality. The conventional roughening process often ends up with uneven thickness and uncontrollable line width of a circuit layer, especially the circuit layer of high-density circuit boards, which affects the electrical quality of the circuit boards and makes it difficult to be applied in circuit boards having a fine circuit. For circuit boards with a high-density layout and a small line width, a badly timed etching process is likely to sever a circuit and result in an open circuit, or tends to undercut the circuit layer and therefore taper the cross-section of the circuit layer downward and reduce the cross-sectional area of the circuit layer, and in consequence the signal transmission quality and electrical performance of the circuit board are adversely affected. On the other hand, an etching process may be too short to roughen the surface of the circuit layer sufficiently, such that the dielectric layer formed on the circuit layer readily detaches from the circuit layer, thereby resulting in poor bonding between the circuit layer and the dielectric layer and adversely affecting the quality of products.

Therefore, there is an urgent need to provide a circuit board structure and fabrication method thereof so as to overcome the above-described drawbacks.

SUMMARY OF THE INVENTION

According to the above drawbacks, an objective of the present invention is to provide a circuit board structure and a fabrication method thereof so as to strengthen the bonding force between the dielectric layer and the circuit layer of the circuit board.

Another objective of the present invention is to provide a circuit board structure and a fabrication method thereof so as to maintain satisfactory electrical performance of the circuit board, thereby ensuring the quality and reliability of the circuit board.

A further objective of the present invention is to provide a circuit board structure and a fabrication method thereof whereby a fine circuit can be formed on the circuit board so as to meet the demand for high-density layouts.

In order to attain the above and other objectives, the present invention provides a circuit board structure which comprises: a circuit board with a circuit layer thereon; a reactant formed on the surface of the circuit layer, wherein the reactant is an organic metallic polymer having a polymer end and a metal ion end; and a dielectric layer formed on the reactant and the circuit board so as to form a metallic bond between the metal ion end and the circuit layer and form a chemical bond between the polymer end and the dielectric layer, thereby strengthening the bonding force between the dielectric layer and the circuit board.

The circuit layer can have a micro-rough surface. The circuit layer is made of Au, Ag, Cu, Fe, Pd, Pb, Sn, Bi, Sb, Zn, Ni, Zr, Mg, In, Te, or Ga.

The metal ion end comprises Au, Ag, Cu, Fe, Pd, Pb, Sn, Zn, or Ni. The polymer end is a long carbon chain, a benzene ring, or a carbocyclic ring.

The present invention further provides a fabrication method of a circuit board structure, comprising: providing a circuit board with a circuit layer thereon; forming a reactant on the surface of the circuit layer, wherein the reactant is an organic metallic polymer having a polymer end and a metal ion end; and forming a dielectric layer on the reactant and the circuit board such that a metallic bond can be formed between the metal ion end and the circuit layer and a chemical bond can be formed between the polymer end and the dielectric layer, thereby strengthening the bonding force between the dielectric layer and the circuit board.

The fabrication method further comprises performing micro-etch pretreatment on the circuit layer so as to form a micro-rough surface on the circuit layer. The circuit layer can be made of Au, Ag, Cu, Fe, Pd, Pb, Sn, Bi, Sb, Zn, Ni, Zr, Mg, In, Te, or Ga.

The metal ion end comprises Au, Ag, Cu, Fe, Pd, Pb, Sn, Zn, or Ni. The polymer end is a long carbon chain, a benzene ring, or a carbocyclic ring.

In the present invention, the dielectric layer can be a solder mask layer.

Therefore, the present invention comprises forming a reactant on the surface of a circuit layer, or performing micro-etch pretreatment on the circuit layer beforehand so as to form a micro-rough surface on the circuit layer and then forming a reactant on the surface of the circuit layer, wherein the reactant is made of an organic metallic polymer having a polymer end and a metal ion end. The polymer end is bonded to the surface of the circuit board through a chemical bond so as to increase the bonding force of the dielectric layer on the circuit layer. The polymer end and the dielectric layer have similar properties and are bonded together through adsorption between molecules, the metal ion end and the circuit layer have similar properties and are bonded together through a metallic bond. Thus, the bonding force between the circuit layer and the dielectric layer is strengthened through the reactant. Further, the present invention prevents formation of excessively roughened surfaces and therefore prevents undercutting. The desirable shape of the circuit remains intact in the present invention, and thus satisfactory electrical performance of the circuit board is maintained, thereby ensuring the quality and reliability of the circuit board. Furthermore, the present invention is applicable to a fine circuit process. Thus, the present invention overcomes the drawbacks of a conventional etching process.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification.

First Embodiment

Figure 1A:
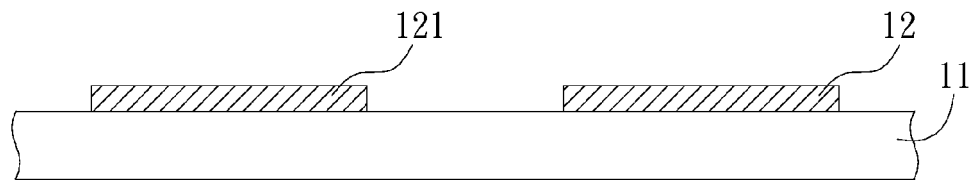
FIGS. 1A to 1C are cross-sectional views showing a conventional circuit board structure with a dielectric layer formed on a roughened surface of a circuit layer.
Figure 1B:
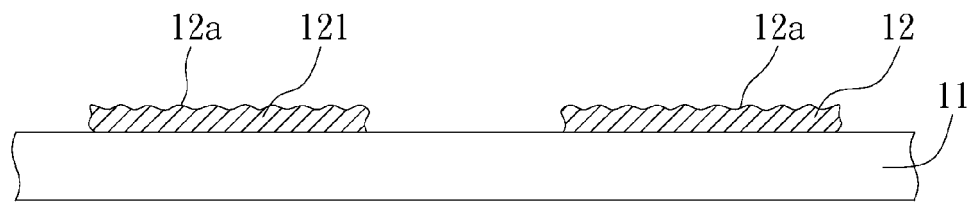
Figure 1C:
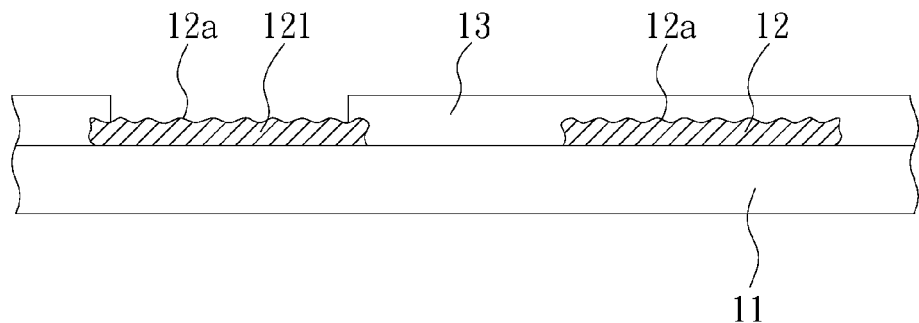
Figure 2A:
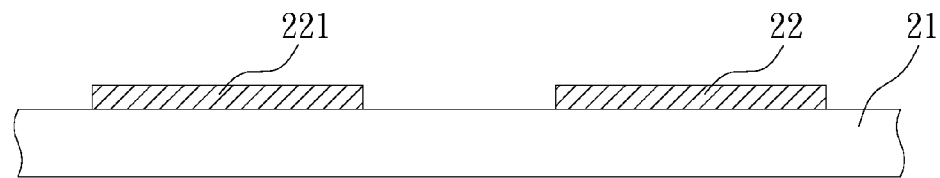
FIGS. 2A to 2C are cross-sectional views showing a circuit board structure and fabrication method thereof according to the first embodiment of the present invention.
Figure 2B:
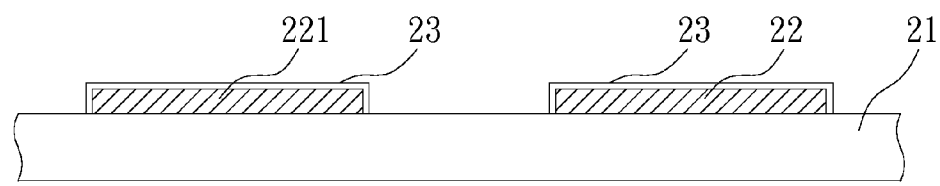
Figure 2C:
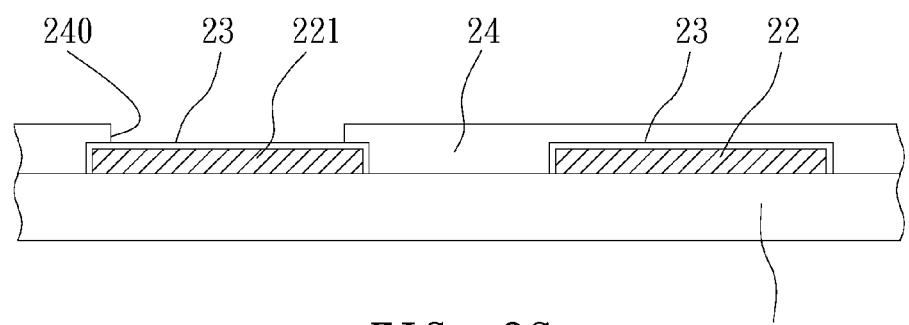

FIGS. 2A to 2C are cross-sectional views showing a fabrication method of a circuit board structure according to the first embodiment of the present invention.

Referring to FIG. 2A, a circuit board 21 is provided. The circuit board 21 is a single-layer or multi-layer circuit board required for a front-end circuit process. The circuit board 21 has a circuit layer 22 thereon. The circuit layer 22 comprises a plurality of electrically connecting pads 221 (or known as electrically connecting lands 221). The circuit layer 22 is made of Au, Ag, Cu, Fe, Pd, Pb, Sn, Bi, Sb, Zn, Ni, Zr, Mg, In, Te, or Ga.

Referring to FIG. 2B, a reactant 23 is formed on the circuit board 21, the reactant 23 formed being limited to the surface of a circuit layer 22, wherein the reactant 23 is an organic metallic polymer with a polymer end and a metal ion end. The polymer end is bonded to the surface of the circuit board 21 by a chemical bond. The metal ion end of the reactant 23 can be bonded to the circuit layer 22 on the circuit board 21 by a metallic bond. The polymer end of the organic metallic polymer is a long carbon chain, a benzene ring, or a carbocyclic ring. The metal ion end of the organic metallic polymer comprises Au, Ag, Cu, Fe, Pd, Pb, Sn, Zn, or Ni.

As shown in FIG. 2C, a dielectric layer 24 is formed above the reactant 23 on the circuit board 21 by lamination or coating, wherein the dielectric layer 24 is a solder mask layer. The dielectric layer 24 has at least an opening 240 for exposing the electrically connecting pads 221. As both the polymer end of the reactant 23 and the dielectric layer 24 are made of nonmetallic material and have similar properties, the polymer end of the reactant 23 can be bonded to the dielectric layer 24 through adsorption between molecules. As both the metal ion end of the reactant 23 and the circuit layer 22 are metallic material and have similar metallic properties, a metallic bond is formed between the metal ion end and the circuit layer. As a result, the reactant 23 enables the dielectric layer 24 to be efficiently bonded to the surface of the circuit layer 22. The bonding of the reactant 23 to the circuit layer 22 and the dielectric layer 24 can be examined by chemical element analysis as opposed to a physical means. The reactant 23 is depicted in the drawings only for an illustrative purpose.

To perform a circuit build-up process, it is necessary to remove the organic metallic polymer-containing reactant 23 formed on the electrically connecting pads 221. Micro-etch pretreatment is performed on the electrically connecting pads 221 so as to remove the reactant 23 from the surfaces of the electrically connecting pads 221. Alternatively, both the dielectric layer and the reactant 23 formed on the surfaces of the electrically connecting pads 221 are concurrently removed by laser ablation before a circuit build-up process is performed. Conductive elements, such as solder balls or pins, can be mounted on the electrically connecting pads for electrical connection with an external electronic element.

In addition to the aforesaid fabrication method, the present invention provides a circuit board structure comprising: a circuit board 21 with a circuit layer 22 thereon; a reactant 23 formed on the surface of the circuit layer 22, wherein the reactant 23 is an organic metallic polymer having a polymer end and a metal ion end; and a dielectric layer 24 formed over the reactant 23 and the circuit board 21 such that a metallic bond is formed between the metal ion end of the reactant 23 and the circuit layer 22, and a chemical bond is formed between the polymer end of the reactant 23 and the dielectric layer 24, thereby strengthening the bonding force between the dielectric layer 24 and the circuit board 21.

Since the present invention spares the need of roughening the surface of a circuit layer by etching, the present invention prevents the chemical etching of a circuit layer from ending up with an excessively roughened surface which is otherwise accompanied by open circuits or undercutting, thus maintaining the desirable shape of the circuit and satisfactory electrical performance of the circuit board, and ensuring the quality and reliability of the circuit board. Also, the present invention is applicable to a fine circuit process.

Second Embodiment

FIGS. 3A to 3D are cross-sectional views showing a fabrication method of a circuit board structure according to the second embodiment. The second embodiment differs from the first embodiment in that the second embodiment further discloses performing micro-etch pretreatment on the circuit layer.

Figure 3A:
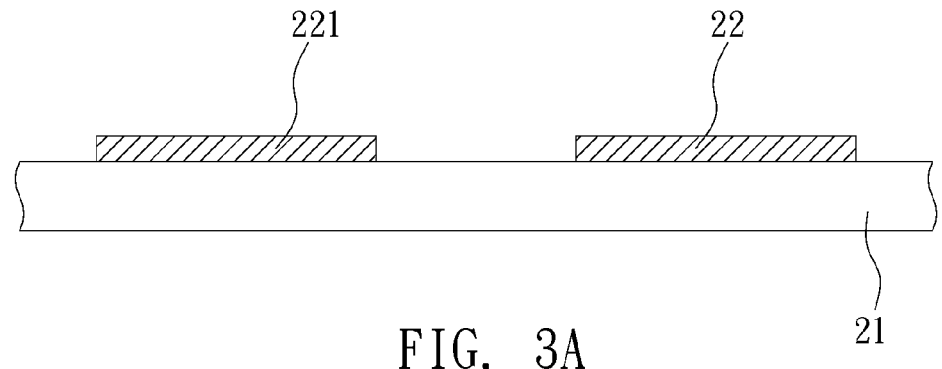
FIGS. 3A to 3D are cross-sectional views showing a circuit board structure and fabrication method thereof according to the second embodiment of the present invention.

Referring to FIG. 3A, a circuit board 21 with a circuit layer 22 thereon is provided. The circuit layer 22 has a plurality of electrically connecting pads 221 (or known as electrically connecting lands 221).

Figure 3B:
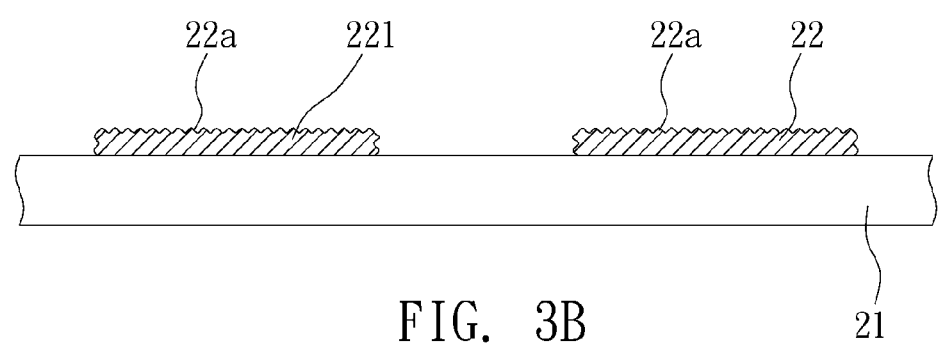

As shown in FIG. 3B, micro-etch pretreatment is performed on the surface of the circuit layer 22 so as to form a micro-rough surface 22a on the circuit layer 22. The micro-rough surface 22a is a fine, rough surface.

Figure 3C:
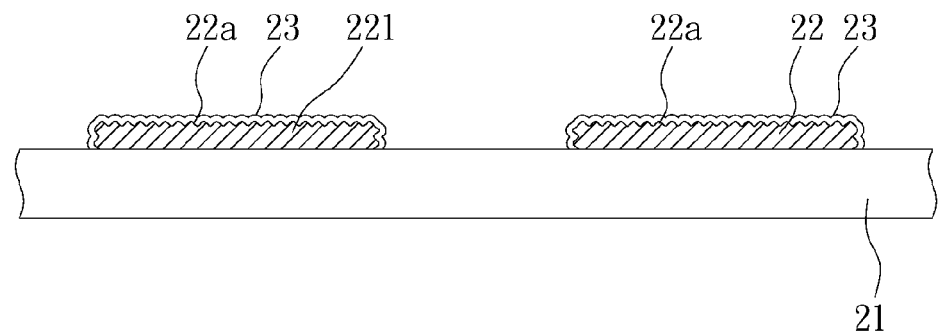

As shown in FIG. 3C, a reactant 23 is formed on the circuit layer 22, the reactant 23 formed being limited to the surface of a circuit layer 22, wherein the reactant 23 has a polymer end and a metal ion end. The polymer end can be bonded to the surface of the circuit board 21 through a chemical bond. The metal ion end can be bonded to the circuit layer 22 on the circuit board 21 through a metallic bond. The polymer end is a long carbon chain, a benzene ring, or a carbocyclic ring. The metal ion end comprises Au, Ag, Cu, Fe, Pd, Pb, Sn, Zn, or Ni.

Figure 3D:
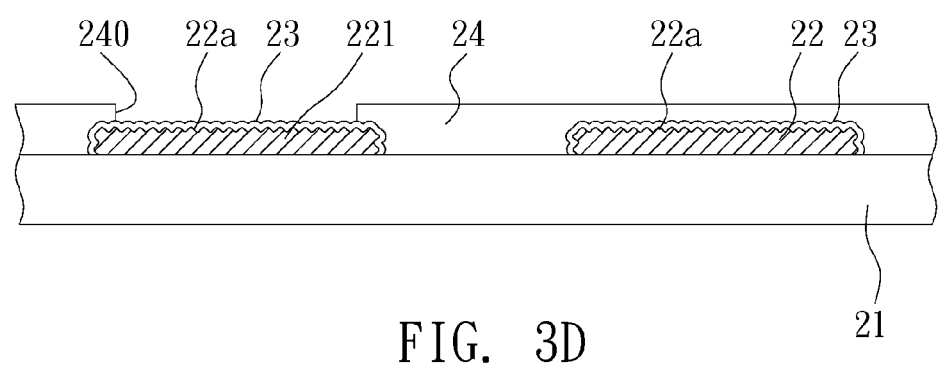

Referring to FIG. 3D, a dielectric layer 24 is formed over the reactant 23 on the circuit board 21, and the polymer end of the reactant 23 is coupled to the dielectric layer 24 through a chemical bond, wherein the dielectric layer 24 is a solder mask layer. At least one opening 240 is formed in the dielectric layer 24 to expose the electrically connecting pads 221. The principle of bonding the reactant 23 to the circuit layer 22 and the dielectric layer 24 is illustrated with the first embodiment and therefore the detailed description thereof is omitted here.

In addition to the aforesaid fabrication method, the present invention discloses another circuit board structure which comprises: a circuit board 21 with a circuit layer 22 thereon, wherein the circuit layer 22 has a micro-rough surface; a reactant 23 formed on the surface of circuit layer 22 with the micro-rough surface, wherein the reactant is an organic metallic polymer having a polymer end and a metal ion end; and a dielectric layer 24 formed over the reactant 23 and the circuit board 21 such that a metallic bond can be formed between the metal ion end of the reactant 23 and the circuit layer 22 and a chemical bond can be formed between the polymer end of the reactant 23 and the dielectric layer 24, thereby strengthening the bonding force between the dielectric layer 24 and the circuit board 21.

Therefore, the present invention essentially comprises forming a reactant on the surface of a circuit layer, or performing micro-etch pretreatment on the surface of the circuit layer so as to form a micro-rough surface on the circuit layer and then forming a reactant on the surface of the circuit layer, wherein the reactant is an organic metallic polymer having a polymer end and a metal ion end, the polymer end is bonded to the surface of the circuit board through a chemical bond so as to increase the bonding force whereby the dielectric layer is bonded to the surface of the circuit layer. The polymer end and the dielectric layer have similar properties and are bonded together through adsorption between molecules. The metal ion end and the circuit layer have metallic properties in common and are bonded together through a metallic bond. Thus, the bonding force between the circuit layer and the dielectric layer is strengthened by means of the reactant. Further, the present invention prevents formation of an excessively roughened surface and thereby prevents undercutting. The present invention maintains the desirable shape of the circuit and satisfactory electrical performance of the circuit board, thereby ensuring the quality and reliability of the circuit board. Furthermore, the present invention is applicable to a fine circuit process. Thus, the present invention overcomes the drawbacks of a conventional etching process.

The above detailed descriptions of the embodiments are only to illustrate the preferred implementation according to the present invention, and it is not to limit the scope of the present invention, Accordingly, all modifications and variations made by persons with ordinary skill in the art should fall within the scope of the present invention as defined by the appended claims.

What is claimed is:

1. A circuit board structure, comprising:
    a circuit board with a circuit layer thereon;
    a reactant layer formed on the circuit layer so as to cover top and side surfaces of the circuit layer, wherein the reactant layer comprises an organic metallic polymer having a polymer end and a metal ion end; and
    a dielectric layer formed on the reactant layer and the circuit board so as to form a metallic bond between the metal ion end of the reactant layer and the circuit layer and form a chemical bond between the polymer end of the reactant layer and the dielectric layer, thereby strengthening the bonding force between the dielectric layer and the circuit board; said circuit layer has a plurality of electrically connecting pads, and at least an opening is formed in the dielectric layer to expose the reactant layer on surfaces of the electrically connecting pads.

2. The circuit board structure of claim 1, wherein the circuit layer is made of one selected from the group consisting of Au, Ag, Cu, Fe, Pd, Pb, Sn, Bi, Sb, Zn, Ni, Zr, Mg, In, Te, and Ga.

3. The circuit board structure of claim 1, wherein the circuit layer has a micro-rough surface.

4. The circuit board structure of claim 1, wherein the metal ion end comprises one selected from the group consisting of Au, Ag, Cu, Fe, Pd, Pb, Sn, Zn, and Ni.

5. The circuit board structure of claim 1, wherein the polymer end is one selected from the group consisting of long carbon chain, benzene ring, and carbocyclic ring.

6. The circuit board structure of claim 1, wherein the dielectric layer is a solder mask layer.

7. A fabrication method of a circuit board structure, comprising:
    providing a circuit board with a circuit layer thereon;
    forming a reactant layer formed on the circuit layer so as to cover top and side surfaces of the circuit layer, wherein the reactant layer comprises an organic metallic polymer having a polymer end and a metal ion end; and
    forming a dielectric layer on the reactant layer and the circuit board, forming a metallic bond between the metal ion end of the reactant layer and the circuit layer, forming a chemical bond between the polymer end of the reactant layer and the dielectric layer, so as to strengthen the bonding force between the dielectric layer and the circuit board; said circuit layer has a plurality of electrically connecting pads, and at least an opening is formed in the dielectric layer to expose the reactant layer on surfaces of the electrically connecting pads.

8. The method of claim 7, wherein the circuit layer is made of one selected from the group consisting of Au, Ag, Cu, Fe, Pd, Pb, Sn, Bi, Sb, Zn, Ni, Zr, Mg, In, Te, and Ga.

9. The method of claim 7 further comprising performing micro-etch pretreatment on the circuit layer so as to form a micro-rough surface on the circuit layer, and then forming the reactant on the micro-rough surface of the circuit layer.

10. The method of claim 7, wherein the metal ion end comprises one selected from the group consisting of Au, Ag, Cu, Fe, Pd, Pb, Sn, Zn, and Ni.

11. The method of claim 7, wherein the polymer end is one selected from the group consisting of long carbon chain, benzene ring, and carbocyclic ring.

12. The method of claim 7, wherein the dielectric layer is a solder mask layer.

* * * * *